(12) United States Patent
Tsironis

(10) Patent No.: US 10,804,872 B1
(45) Date of Patent: Oct. 13, 2020

(54) LIQUID COOLED HIGH POWER IMPEDANCE TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 16/266,711

(22) Filed: Feb. 4, 2019

(51) Int. Cl.
*H03H 7/38* (2006.01)
*H05K 7/20* (2006.01)
*H01P 5/04* (2006.01)

(52) U.S. Cl.
CPC ............ *H03H 7/38* (2013.01); *H01P 5/04* (2013.01); *H05K 7/20218* (2013.01); *H05K 7/20927* (2013.01)

(58) Field of Classification Search
CPC ........... H05K 7/20218; H05K 7/20236; H05K 7/20263; H05K 7/20272; H05K 7/20281; H05K 7/2039; H05K 7/20927; H03H 7/38; H03H 7/40
USPC .......... 333/263, 17.3, 32, 33, 22 F, 155, 229, 333/234
See application file for complete search history.

(56) References Cited

U.S. PATENT DOCUMENTS

| 6,674,293 | B1 | | 1/2004 | Tsironis | |
| 8,975,988 | B1 | * | 3/2015 | Tsironis | .................... H01P 5/04 333/17.3 |
| 9,590,486 | B2 | * | 3/2017 | MacLennan | ........ H01F 27/2823 |
| 9,666,928 | B1 | | 5/2017 | Tsironis | |

OTHER PUBLICATIONS

Load Pull [online], Wikipedia [retrieved on Nov. 18, 2016], Retrieved from Internet <URL:https://en.wikipedia-org/wiki/Load_pull>.
"Computer Controlled Microwave Tuner—CCMT", Product Note 41, Focus Microwaves Jan. 1998.
Standing wave ratio, VSWR [online], Wikipedia [retrieved Mar. 2, 2017], Retrieved from Internet <URL:http://en.wikipedia.org wiki/Standing_wave_ratio>.
Invar [online], Wikipedia [retrieved Jan. 11, 2019]. Retrieved from Internet<URL:http://en.wikipedia.org/wiki/Invar>.
7/16 Connector Series [online], Amphenol RF [retrieved on Jan. 31, 2019], Retrieved from Internet <URL:https://www.amphenolrf.com/connectors/7-16.html>.
Thermoelectric cooling [online], Wikipedia [retrieved Jan. 31, 2019], Retrieved from Internet URL:https://en.wikipedia.org/wiki/Thermoelectric_cooling>.

* cited by examiner

*Primary Examiner* — Stephen E. Jones

(57) ABSTRACT

High power impedance tuners suffer from intense heating of the center conductor of the tuner airline (slabline), due to dissipated RF and DC power and, in addition of high electric field between the metallic tuning probe (slug) and the center conductor, also from associated thermal expansion causing bending of the center conductor and electrical short. If the thermal expansion cannot be accommodated by structural means, the center conductor is cooled using re-circulating low loss dielectric liquid (Mineral Oil), which fills the slabline and dissipates the heat. The cooling dielectric liquid is guided through an external refrigerator and recycled back into the slabline.

7 Claims, 13 Drawing Sheets

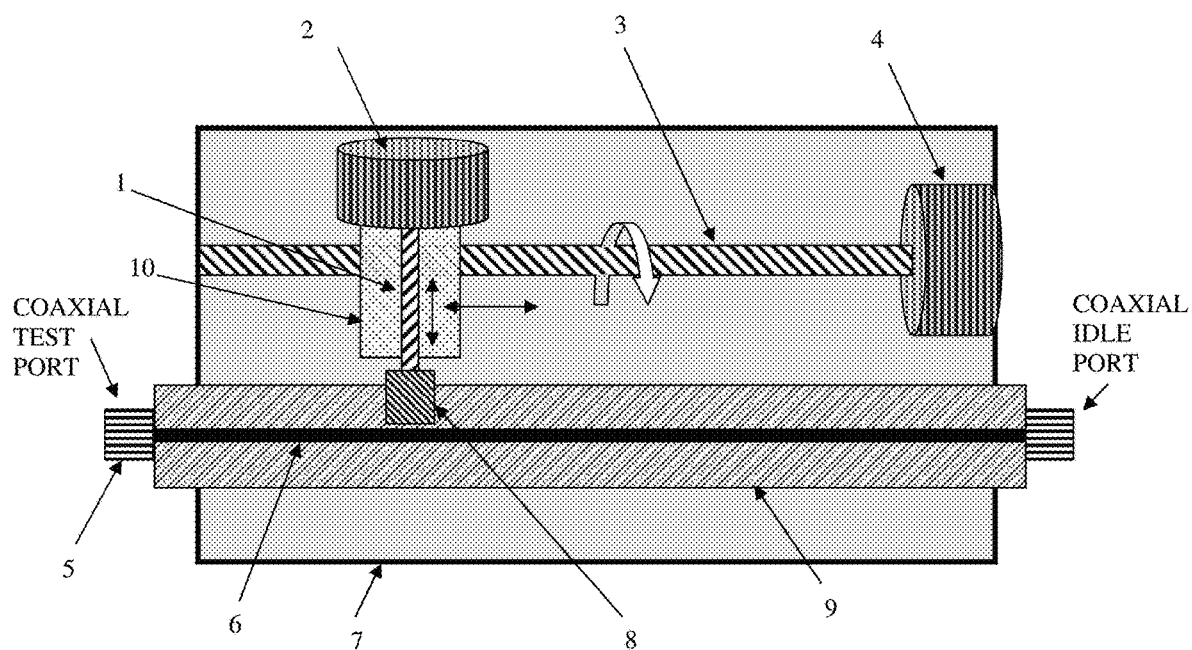
FIG. 1: Prior art

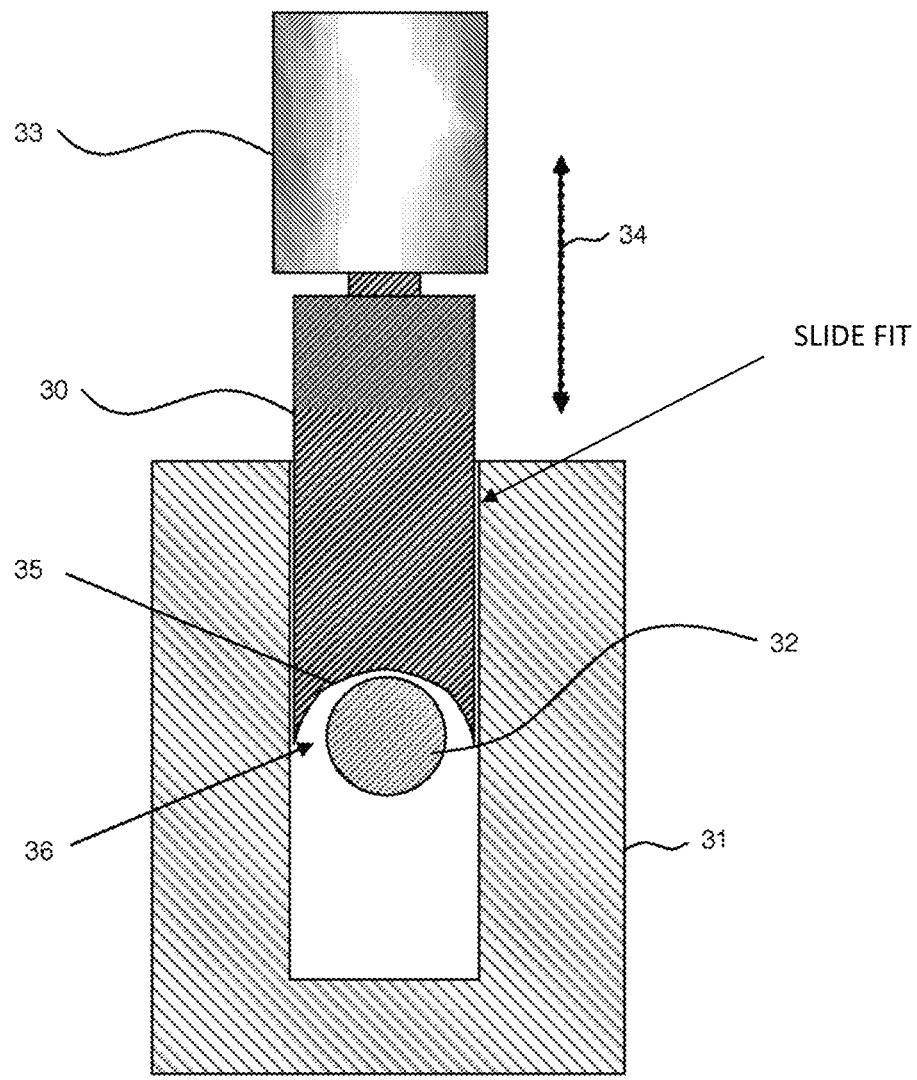
FIG. 2: Prior art

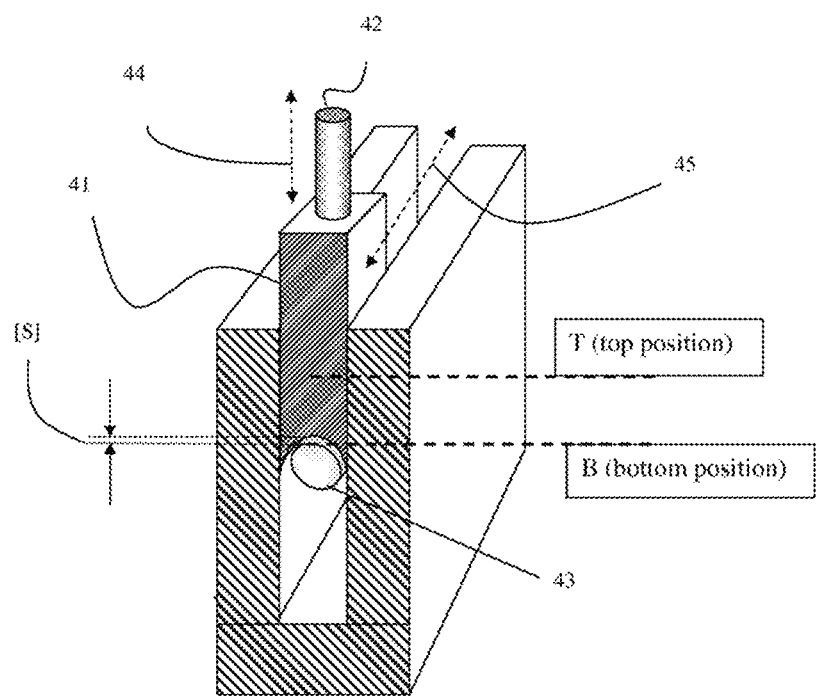
FIG. 3: Prior art:

b1)  b2)  b3)

| | Epsilon | sqrt(epsilon) | tan delta | tan delta / sqrt(epsilon) |
|---|---|---|---|---|
| Teflon | 2.0 | 1.4 | .00028 | .000198 |
| Acetone | 23.0 | 4.8 | .05000 | .010426 |
| Water | 80.0 | 8.9 | .01000 | .001118 |
| Mineral oil | 2.2 | 1.5 | .00016 | .000108 |
| Silicon oil | 2.7 | 1.6 | .00010 | .000061 |
| Castor oil | 4.6 | 2.1 | .00100 | .000466 |
| ethanol | 25.8 | 5.1 | .05000 | .009844 |
| methanol | 32.0 | 5.7 | .90000 | .159099 |
| ester oil | 3.2 | 1.8 | .00015 | .000084 |
| air | 1.0 | 1.0 | .000000 | .000000 |

FIG. 10: Prior art

THERMOELECTRIC
COOLER

RADIATOR

LIQUID COOLED HIGH POWER IMPEDANCE TUNER

PRIORITY CLAIM

Not Applicable

CROSS-REFERENCE TO RELATED ARTICLES

1. Load Pull [online], Wikipedia [retrieved on Nov. 18, 2016], Retrieved from Internet <URL:https://en.wikipedia.org/wiki/Load_pull>.
2. "Computer Controlled Microwave Tuner—CCMT", Product Note 41, Focus Microwaves January 1998.
3. Standing wave ratio, VSWR [online], Wikipedia [retrieved Mar. 2, 2017], Retrieved from Internet <URL: http://en.wikipedia.org/wiki/Standing_wave_ratio>.
4. Tsironis, C, U.S. Pat. No. 6,674,293; Adaptable pre-matched tuner system and method
5. Invar [online], Wikipedia [retrieved Jan. 11, 2019]. Retrieved from Internet <URL:http://en.wikipedia.org/wiki/Invar>.
6. Tsironis, C, U.S. Pat. No. 9,666,928, "High power slide screw tuners", FIG. 7
7. 7/16 Connector Series [online], Amphenol RF [retrieved on Jan. 1, 2019], Retrieved from Internet <URL:https://www.amphenolrf.com/connectors/7-16.html>.
8. Thermoelectric cooling [online], Wikipedia [retrieved Jan. 31, 2019], Retrieved from Internet URL:https://en.wikipedia.org/wiki/Thermoelectric_cooling>.

BACKGROUND OF THE INVENTION

This invention relates to RF load and source pull testing of high-power RF transistors and amplifiers using remotely controlled electro-mechanical impedance tuners.

Modern design of high-power RF amplifiers used in various communication systems, requires accurate knowledge of the active device's (microwave transistor's) characteristics. In such circuits, it is insufficient for the transistors, which operate in their highly non-linear regime, close to power saturation, to be described using non-linear numeric models, instead complete high-power testing is required.

A popular method for testing and characterizing such microwave components (transistors, DUT) in the non-linear region of operation is "load pull" (see ref. 1). Load pull is a measurement technique employing microwave impedance tuners (FIG. 1) and other microwave test equipment, such as signal sources, test fixtures holding the device under test (DUT) and power meters, the whole controlled by a computer; the computer controls and communicates with the tuners and other equipment using digital cables. The tuners are used in order to manipulate the microwave impedance conditions under which the Device Under Test is tested (see ref. 1 and 2); tuners allow determining the optimum impedance conditions for designing amplifiers and other microwave components for specific performance targets, such as gain, efficiency, inter-modulation etc.; this document refers hence to "tuners" as being "impedance tuners", in order to distinct from "tuned receivers (radios)", popularly called elsewhere also "tuners" because of the included tuning circuits (see ref. 2).

Impedance tuners comprise a transmission line (9) and adjustable tuning probes (8), see FIG. 1, in a solid housing (7); the transmission line is typically a low loss parallel plate airline (slabline) terminating in a test (5) and an idle port, both ports being in form of coaxial connectors; the probe (8) is attached to a precision vertical axis (1) which is mounted in a mobile carriage (10) sliding along the axis of the slabline; the axis (1) can move the probe (8) vertically towards the center conductor (6) using vertical motor (2) and the carriage (10) can move the probe (8) horizontally parallel to said center conductor (6) using Acme rod (3) and horizontal motor (4). The vertical movement controls the amplitude of the reflection factor seen at the tuner test port whereas the horizontal movement controls its phase. This way the whole Smith chart is covered allowing a quasi-infinity of impedances (FIG. 12A) from Zmin to Zmax to be synthesized at any given frequency within the "tuning range" (the maximum obtainable reflection factor GAMMA) of the tuner. Typical values of state-of the art tuners are |Zmin|=2 Ohm and |Zmax|=1250 Ohm; this corresponds to Voltage Standing Wave Ratio (VSWR) of 25:1 (FIG. 12A). The relation between reflection factor and impedance is given by GAMMA=|GAMMA|*exp(j<Φ>)= (Z−Zo)/(Z+Zo) {1}, wherein Z is the complex impedance Z=R+jX and Zo is the characteristic impedance. A typical value used for Zo is Zo=50 Ohm. The equivalent is the Voltage Standing Wave Ratio: VSWR=(1+|GAMMA|)/(1−|GAMMA|) {2}, (see ref. 3).

Metallic tuning probes (30) or slugs are made in a cubical form (41) with a concave bottom (35) which allows to capture, when approaching vertically (34), controlled by axis (33), (42), the center conductor (32) (43) (see ref. 2 and 4, and FIG. 3), the electric field which is concentrated in the area (36) between the center conductor (32) and the ground planes of the slabline (31) (FIG. 2). This "field capturing" allows creating high and controllable reflection factors. The critical part is the required proximity and accuracy of both the vertical (44) and horizontal (45) probe movement (FIG. 3), whereby changes in the vertical probe position of a few micrometers affects the VSWR by a large amount (see ref. 6).

When DC and microwave power is processed by the tuner, some of it is absorbed by the center conductor (6) of the slabline (9) and converted in heat. This leads to a rise of its temperature and associated, mostly linear, expansion (615, 616 in FIG. 4A) along the axis of the slabline by $\Delta L = \alpha * L * \Delta\Theta$ {3}, whereby L is the total length of the center conductor, $\alpha$ is the thermal expansion coefficient (TEC), typically 12 ppm/degree for steel, and $\Delta\Theta$ the raise in temperature. Since the center conductor (66) has only limited range for expansion this will lead to "bending" (67) in FIG. 4A); "Bending" of the center conductor happens in different ways, depending on the pre-disposition and the anchoring on the coaxial end connectors and it always affects the reflection factor (63), created by the vertical movement (62) at close proximity of the tuning probe (61) to the center conductor (66) of the slabline (64). The center conductor (611, 612, 613), when heated, bends and may either deflect sidewise (617), downwards (614) or upwards (not shown), in which case we may have a short circuit at position (68) in case (617) and when deflecting upwards, or loss of accuracy when the distance between the tuning probe and the center conductor increases (69) (case 614). In either case the effect is at best loss of accuracy or at worst an electrical short and damage of the tuner and/or the DUT.

This invention discloses a method for reducing the temperature raise and the thermal expansion of the center conductor and by that avoiding the risk of short circuit or loss of accuracy.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts Prior Art: a typical automated slide screw load pull tuner.

FIG. 2 depicts Prior Art: cross section of RF probe inside a slotted airline (slabline) approaching the center conductor.

FIG. 3 depicts Prior Art: a perspective view of relevant dimensions and parameters of the operation of a vertically adjustable RF probe (slug).

FIG. 4A depicts the structure and center conductor "buckling"; FIG. 4B, b1), b2) and b3) depict the possible deflection directions of the heated center conductor.

FIG. 10 depicts prior art: a table showing dielectric constant and loss of various materials.

FIG. 12A depicts Smith chart coverage of tuner reflection factor (S11) calibration points at 2 GHz and FIG. 12B depicts tuner repeatability after calibration (vector error |S11.cal-S11.meas|$^2$).

BRIEF DESCRIPTION OF THE INVENTION

Figure 4A:
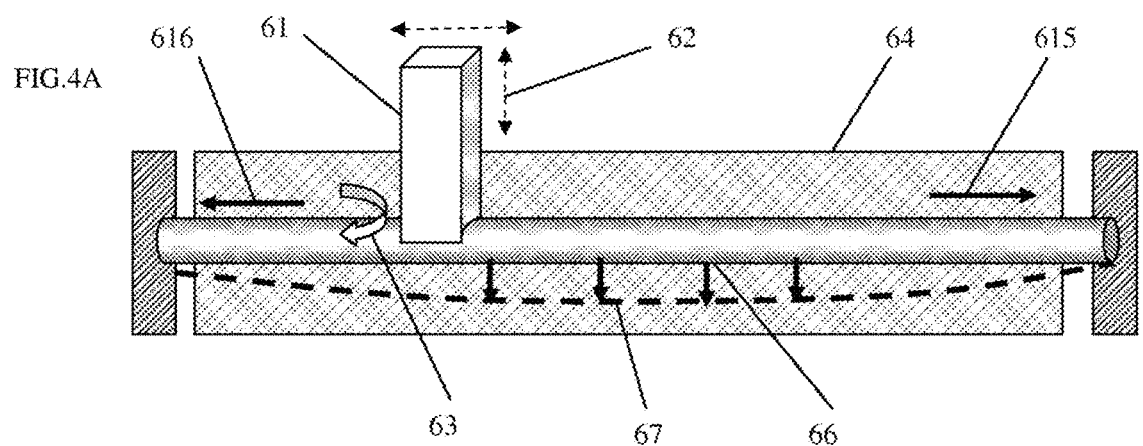
FIGS. 4A and 4B depict center conductor deformation due to heating.
Figure 4B:
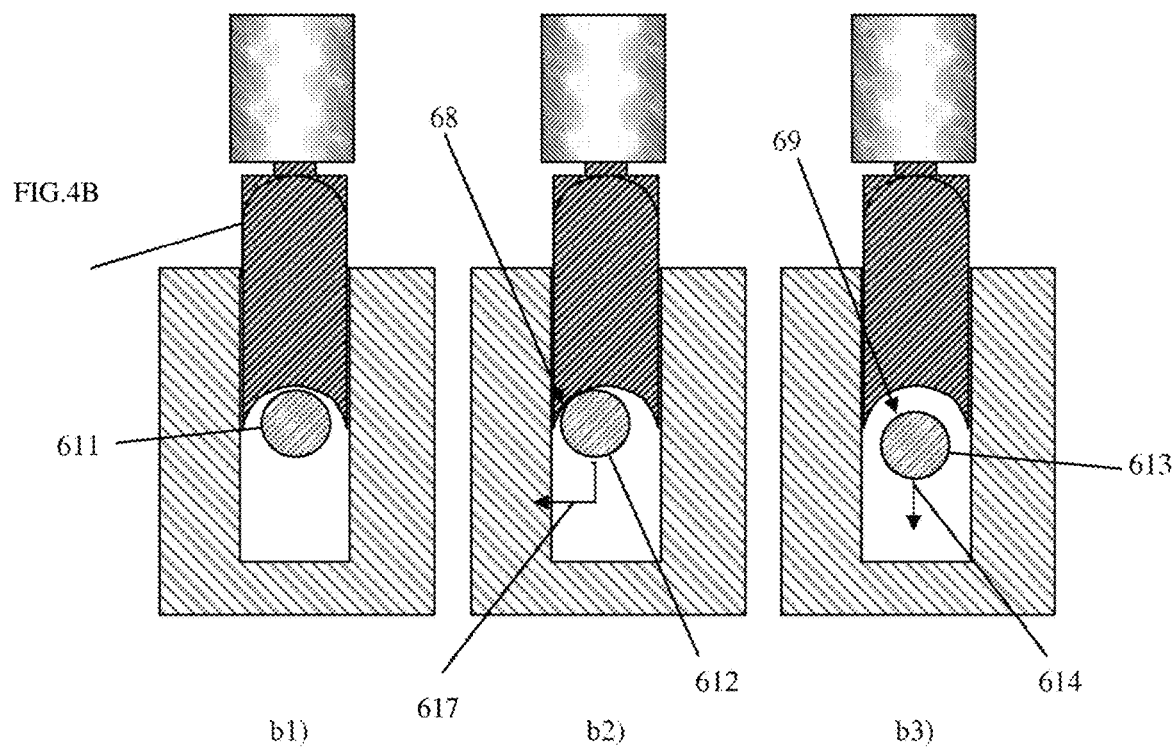

There are three possible situations when high RF and DC power is injected and processed (absorbed) in the slide screw tuner: Since the center conductor has very low mass and is thermally isolated from the environment, a. the center conductor heats and expands, in which case the expansion must be accommodated for using appropriate design, without damage or loss of accuracy, b. the center conductor heats, but does not expand, which can be achieved by using special metallic alloy (INVAR, see ref. 5) for the center conductor, or c. the center conductor is cooled enough to reduce its thermal expansion.

Case c. can be achieved by either blowing cooling air over the center conductor or submerging the center conductor in cooling, low loss, dielectric liquid by filling the slabline channel with this liquid. Experiments have shown that blowing cooling air over the center conductor is not enough (FIG. 7), obviously since the center conductor is cylindrical and creates a laminar flow of the surrounding cooling airflow, and, therefore, does not capture enough of the airflow in order to transfer the heat effectively. The remaining alternative is to use liquid cooling, by submerging the center conductor in cooling liquid, which necessarily must have low loss coefficient.

DETAILED DESCRIPTION OF THE INVENTION

Submerging the center conductor in cooling liquid having low loss (tan $\delta$) coefficient is the preferred embodiment of this invention. The most adequate liquids are Mineral Oil and Silicon Oil (FIG. 10). All hitherto experiments are reported using Mineral Oil.

When dielectric liquid is poured into the slabline slot, the transmission behavior of the airline (slabline) changes. The characteristic impedance of a slabline with 3 mm center conductor and 5.425 mm channel width changes from Zo=50$\Omega$ for air ($\varepsilon_r$=1) to Zo'=33.3$\Omega$ for mineral oil ($\varepsilon_r$=2.2). To re-establish Zo=50$\Omega$ in the Mineral Oil filled slabline without changing the center conductor, the channel must become 8.23 mm wide and the tuning probes (FIG. 2) must be re-designed to slide fit into the new slabline channel. If the operating frequency is well below cutoff frequency this is not a problem. The first traversal electro-magnetic mode appears approximately at the cutoff frequency Fco at which the closest electrical distance between center conductor and sidewall is $\lambda$/8. In the specific case for a slabline filled with air this distance is (5.425−3)/2=1.213 mm corresponding to Fco=30.9 GHz. In the case of a slabline filled with dielectric liquid with $\varepsilon_r$=2.2 and slabline dimensions as above, the cutoff frequency is: Fco=6.25 GHz. If the specific tuner is used below 6 GHz there is no problem. This is compatible with the use of high power 7/16 coaxial connectors and adapters made for high power and having similar cutoff frequency (see ref. 7). The method is, never-the-less valid for higher frequency tuners as well, if the basic dimension rules and appropriate connectors are used.

Beyond cooling the center conductor, there is a further advantage in filling the slabline with dielectric liquid. The electrical length shortens by 1/$\sqrt{\varepsilon_r}$ or the necessary horizontal travel distance at the lowest frequency shortens, and by that the overall tuner size. Using a dielectric of $\varepsilon_r$=2.2 shortens the tuner length by a factor of approximately 1.5, which is significant for low frequency tuners, for which this method is primarily applicable: the tuners must be at least one half of a wavelength long at the lowest frequency, plus the length of carriages, walls and adapters. As an example, an air-filled tuner at 200 MHz is around 80 cm long, whereas filled with 2.2 dielectric oil, it becomes 55 cm long (this includes 5 cm in both cases for the carriage and the other hardware). The method is destined for low frequency tuners, also because the very high (kilowatt range) powers for which this apparatus is made, are available mainly for frequencies between 100 and 2000 MHz.

Figure 6:
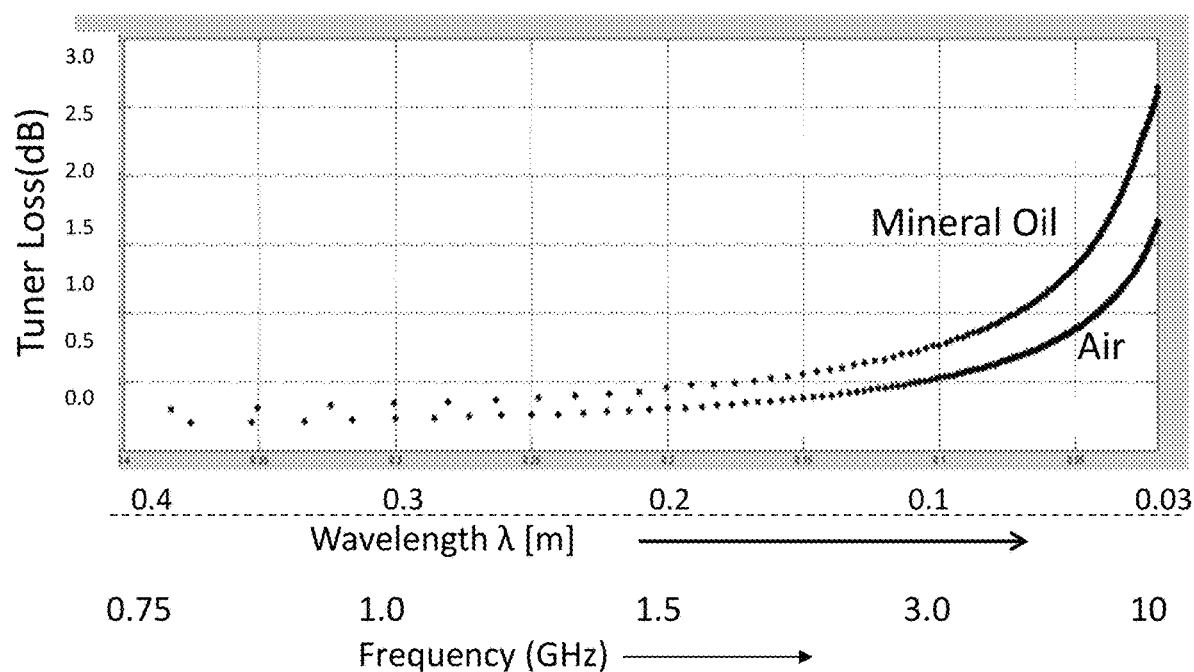
FIG. 6 depicts tuner insertion loss as a function of wavelength ($\lambda$) for a prior art air filled tuner and a tuner whose slabline is filled with dielectric liquid (Mineral Oil).

Mineral Oil is a compatible cooling liquid for RF impedance tuners as shown in FIG. 6. The tuner insertion loss per wavelength of a dielectric liquid (Mineral Oil) compared with a traditional air-filled tuner is shown as a function of wavelength (or frequency) for frequencies between $\lambda$=0.4 m (frequency=750 MHz) to $\lambda$=0.03 m (frequency=10 GHz). The data shows that for frequencies below 1 GHz ($\lambda$=0.3 m) the difference is quasi constant and very small. Since tuner operation at the lowest frequency is restricted to horizontal travel of a trajectory of one half of a wavelength ($\lambda$/2), it is obvious that the proposed solution is viable, with respect to RF loss. In practice at 1 GHz the difference between an air-filled tuner and a Mineral Oil-filled tuner is less than 0.1 dB (0.35−0.25 dB), which is acceptable.

Figure 7:
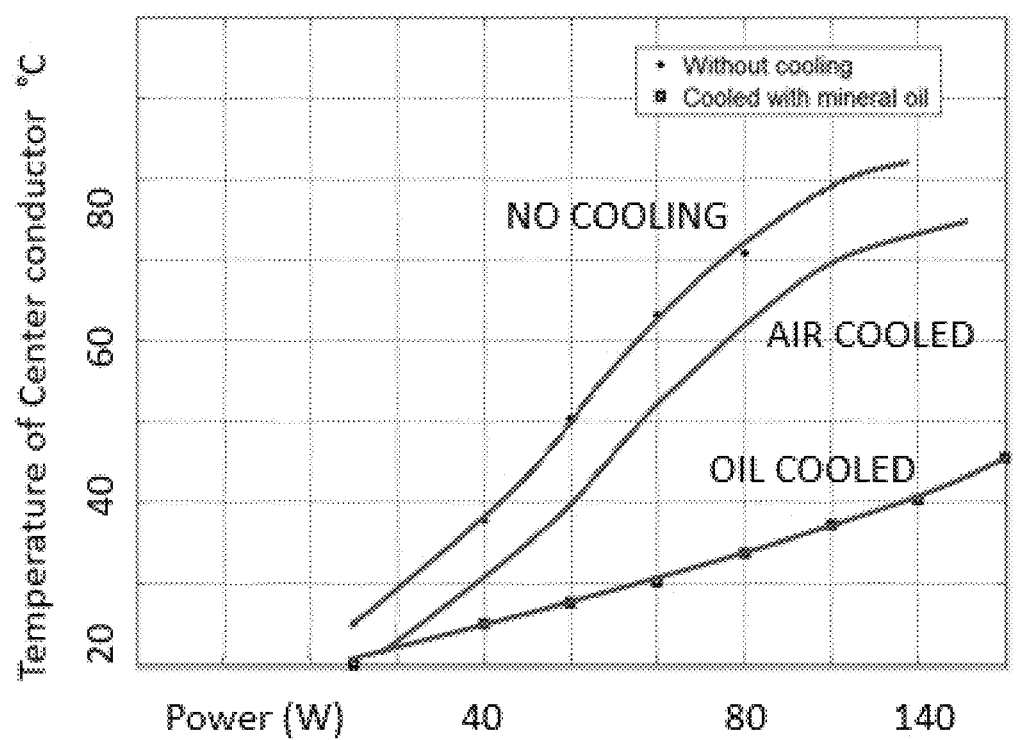
FIG. 7 depicts comparison of the temperature raise of center conductor as a function of dissipated power for various cooling conditions.

It is important to compare the steady state temperature behavior of the center conductor of an actual impedance tuner submitted to various cooling conditions as a function of dissipated power. This is shown in FIG. 7: whereas a non-cooled center conductor reaches rapidly temperatures above 80 degrees Celsius, a forced air-cooled center conductor reaches approximately 10 degrees lower temperature; that is, air-cooling is not very efficient. Instead, a non-recirculating Mineral Oil-filled slabline has its center conductor heated, under the same conditions, at 40 degrees lower temperature than air. This proves the efficiency of cooling the center conductor using dielectric liquid, such as Mineral Oil.

Figure 8:
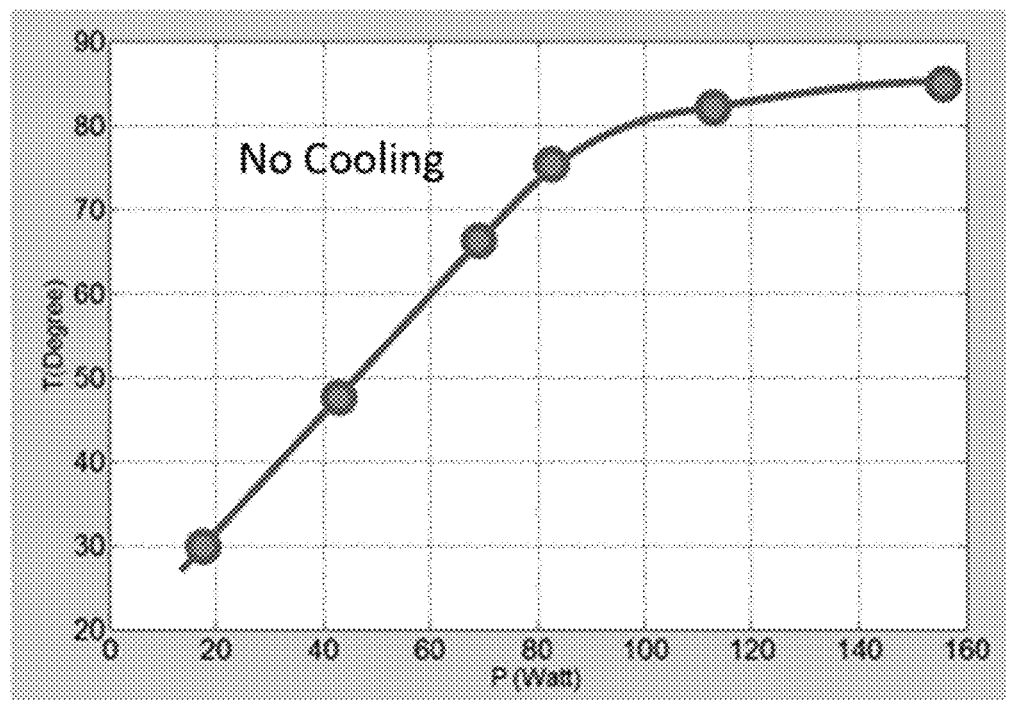
FIG. 8 depicts temperature raise of center conductor as a function of dissipated power of no cooled center conductor.

The heating behavior of air-filled (no cooling) slabline is shown in FIG. 8. After approximately 100 W dissipated power the center conductor stops heating. This means that, for the given room temperature and the slabline-center conductor structure, above this 80 to 90-degree temperature (FIG. 7) the center conductor radiates heat upwards in the environment, reaching a steady state. Of course, the situation is non-acceptable, because at this temperature the center conductor will expand sufficiently to create either damage or loss of accuracy.

Figure 5:
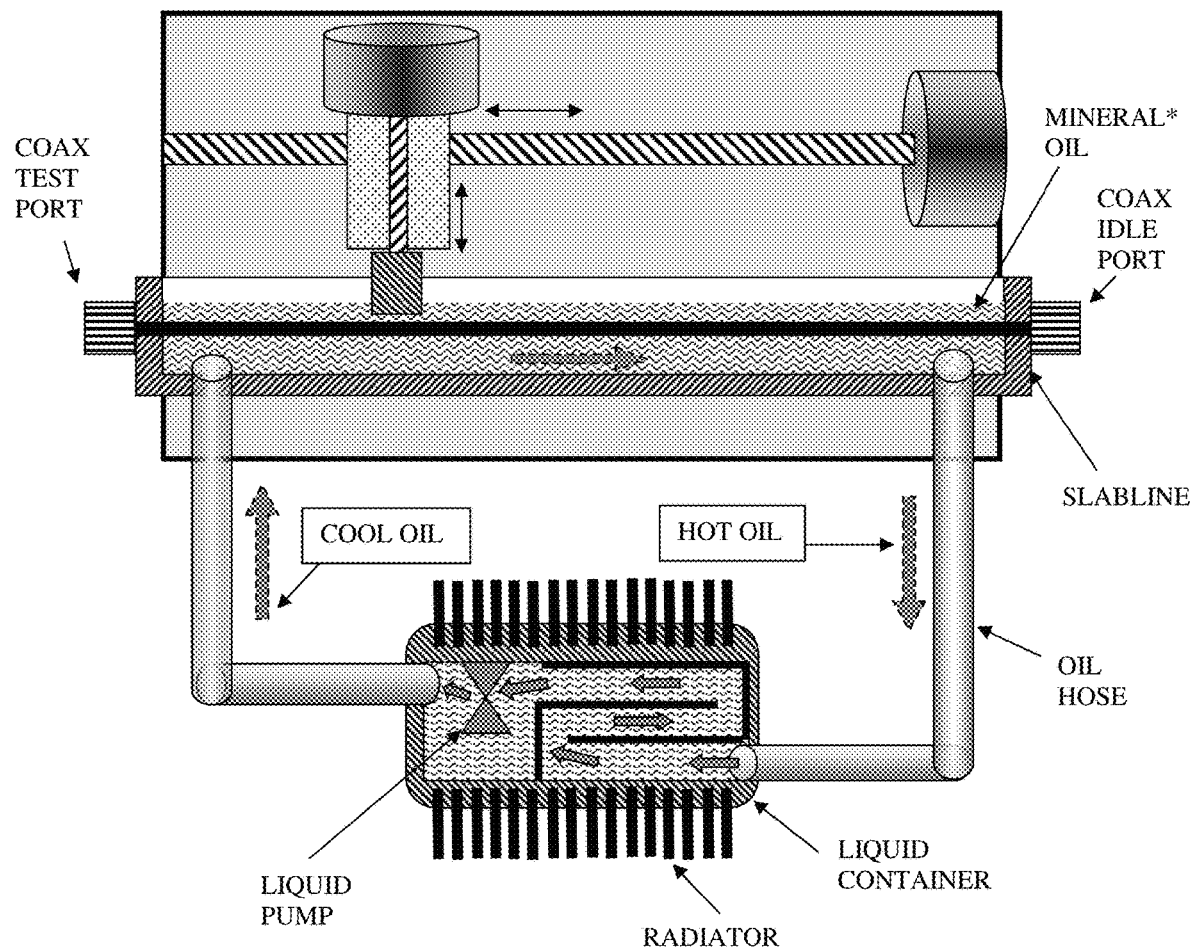
FIG. 5 depicts the temperature control mechanism of the center conductor using re-circulating cooling dielectric liquid (*) Mineral Oil, Silicon Oil or else.

The dielectric liquid-cooled tuner concept is shown in FIG. 5. The slabline is open at the top and sealed on the connector sides and is filled or partially filled with dielectric liquid, ensuring that the center conductor is fully submerged in the liquid. Experiments have shown (FIG. 11) that static liquid absorbs heat at the beginning, but the steady state temperature rises after a while, not as much as without cooling liquid but still, obviously because the mass of cooling liquid and the total surface of internal slabline walls in contact with the liquid is limited. Therefore, it is better to circulate and cool down the liquid (FIG. 11) using pipes that lead from the liquid container to two holes in the slabline, placed preferably at the slabline bottom to avoid disturbing the electromagnetic field; the container comprises radiators for radiating the heat and a liquid pump, commonly available also as an aquarium pump, which sucks hot oil from the extraction pipe and pushes it, cooled down, back through the insertion pipe into the slabline. The liquid container itself can be cooled down using several methods, such as forced air, submerging in ice water, Peltier thermo-electric cooler (see ref. 8) or a mini refrigerator.

Figure 13:
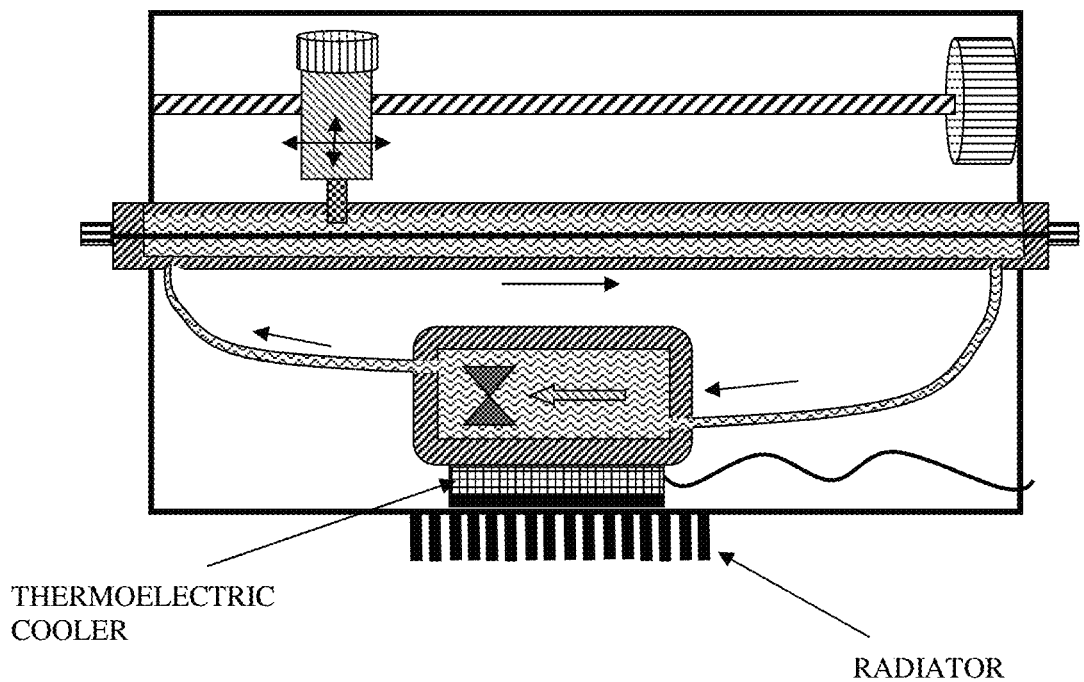
FIG. 13 depicts high power tuner with integrated cooling mechanism.

The entire cooling mechanism can be mounted outside the tuner housing, to avoid re-designing existing equipment, or it can be integrated in a bigger tuner housing (FIG. 13), especially when thermo-electric cooling (see ref. 8) is implemented, which does not require large fans and ice-water containers.

The method is used in heat generating apparatus, such as internal combustion engines, but has never been used in impedance tuners, where the RF loss (tan δ) of the liquid must be as low as possible and the dielectric constant cannot be very high to avoid problems with dimensioning the slabline to obtain 50 Ohm characteristic impedance and with much reduced cut-off frequency (an $\varepsilon_r$=2.2 reduces the cutoff frequency of the 50 Ohm slabline from 30 GHz to 6 GHz). This example shows that a dielectric constant of only 2.2 reduces the cutoff frequency of the 50 Ohm slabline by a factor of 5. Any higher $\varepsilon_r$ would cut into frequencies below 2 GHz. Also, in almost all other cases of a cooling device there is a sealed barrier between the source of the heat and the circulating cooling liquid. Not in this case. In this case it is impossible to contact the center conductor, with anything other than with dielectric low loss liquid such as Mineral or Silicon Oil. It would not make any sense to cool down the whole slabline, because it is thermally isolated from the center conductor.

Figure 9:
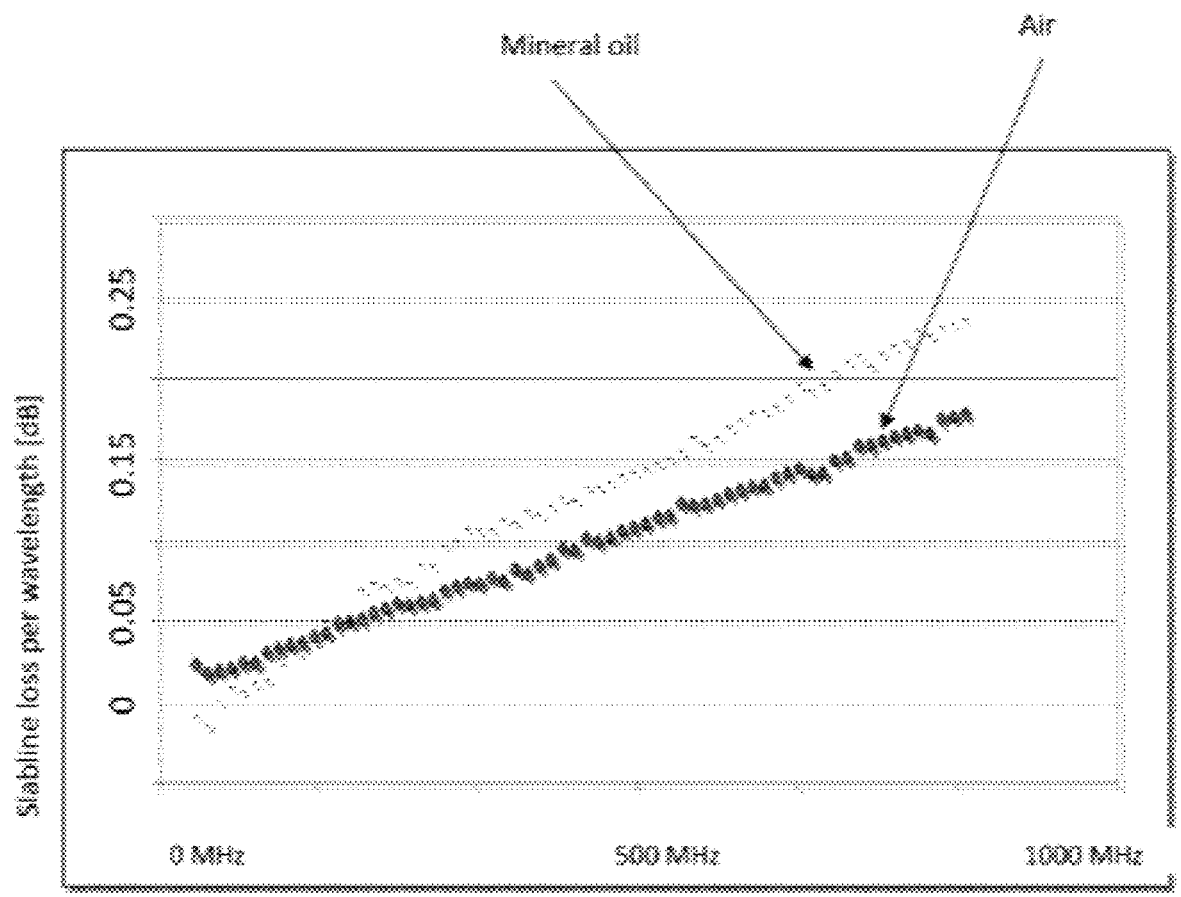
FIG. 9 depicts slabline loss per wavelength as a function of frequency for a slabline filled with air and Mineral Oil.

The measured data shown in FIG. 9 confirm the measurements of FIG. 6. It is obvious that the difference in loss-per-wavelength, even at 1 GHz (a relatively high frequency for this type of tuner), is less than 0.1 dB.

Figure 11:
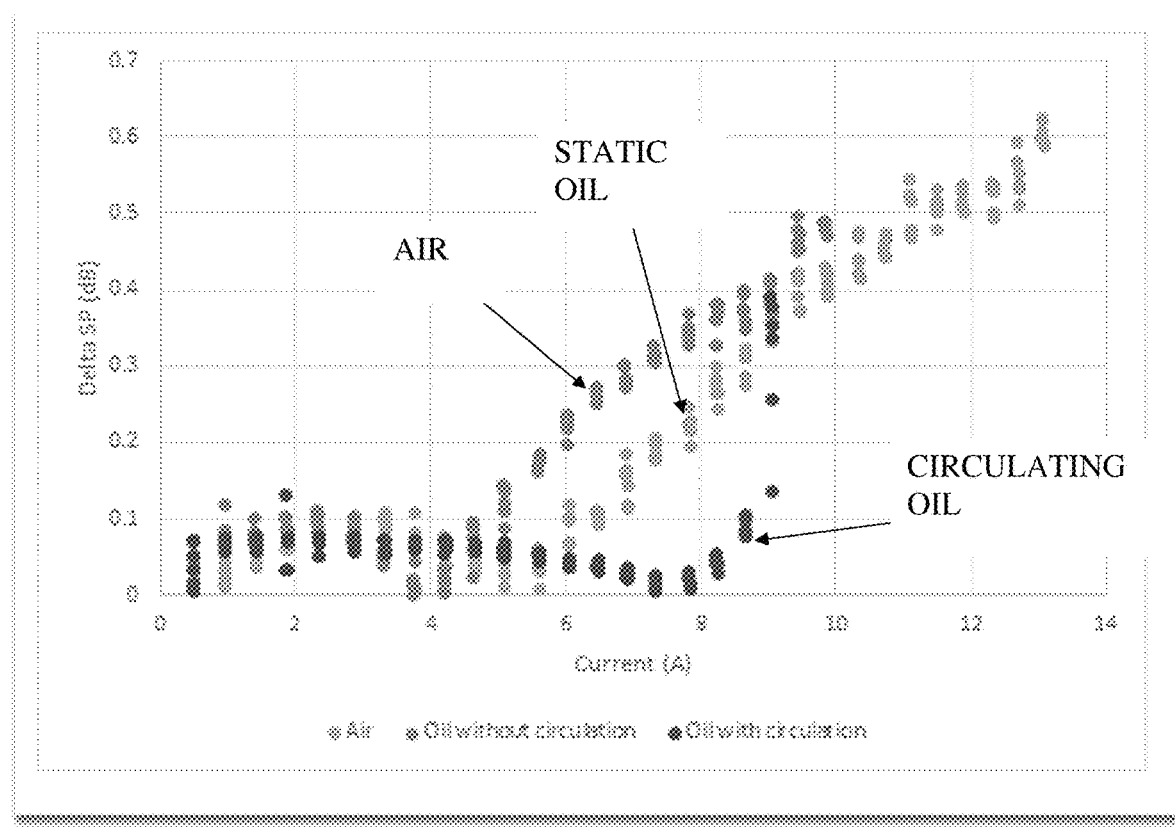
FIG. 11 depicts drift in s-parameter at high tuner reflection setting as a function of dissipated power and various center conductor cooling methods.

The most efficient method for cooling the center conductor seems to be submerging it in circulating and cooled low loss dielectric liquid (FIG. 11). The tuning error in form of S-parameter drift of the tuner has been measured as a function of DC current flowing through the center conductor of the tuner and generating dissipated power. 8 Ampere corresponds roughly to 100 W dissipated power in which case cooling using re-circulating Mineral Oil is clearly beneficial, compared with air-filled slabline and with non-circulating Mineral Oil. The fact that above typically 100 W dissipated power the tuner cooled with circulating Mineral Oil loses accuracy, indicates that the external cooling of the Oil and the quantity of Oil used in this case become insufficient. This means that a careful experiment is required to adjust those parameters but does not invalidate the principle. For all these estimates it should be considered that the real dissipated power in a tuner is roughly 10% to 20% of the maximum RF power, meaning that 100 W dissipated power corresponds to 1000 W RF power.

Figure 12A:
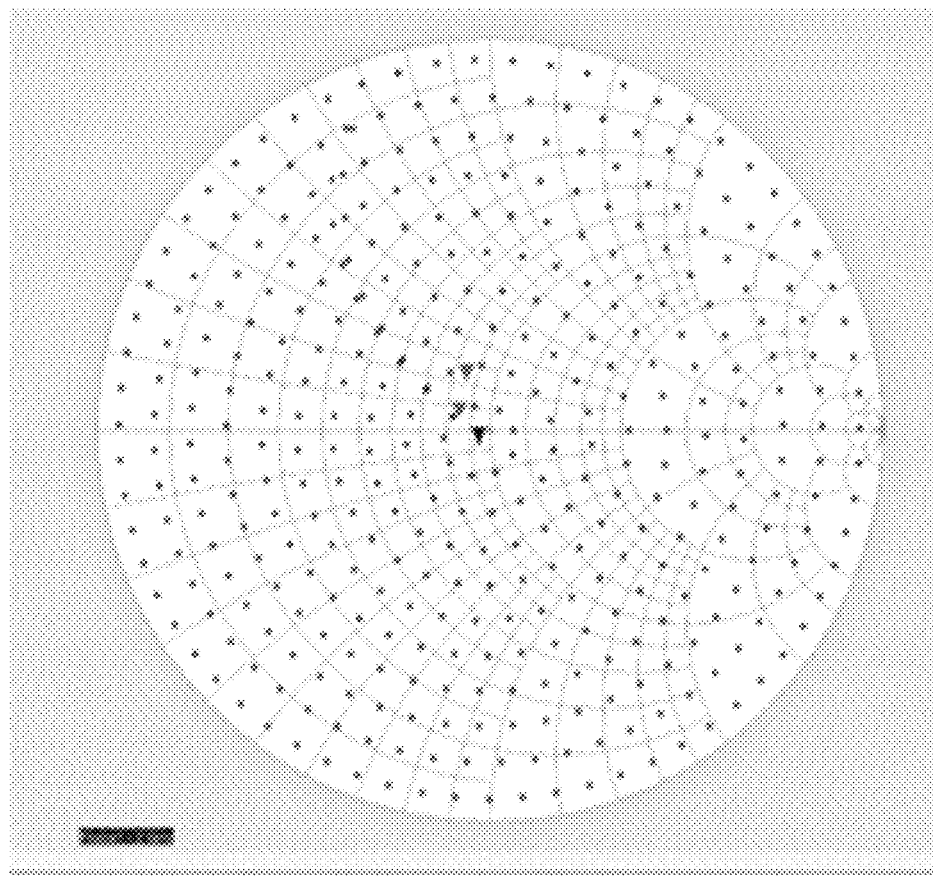
FIGS. 12A and 12B depicts performance of the oil cooled tuner.
Figure 12:
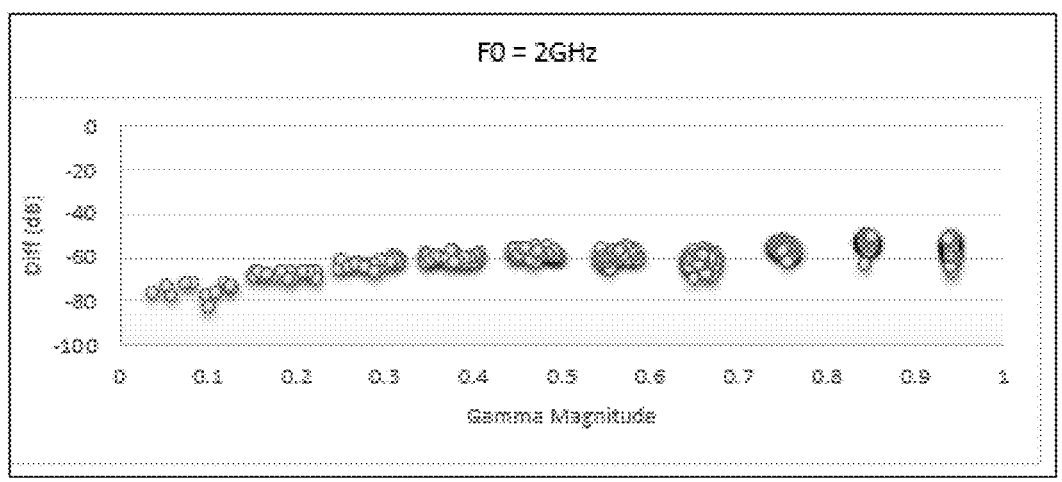

Measured data in FIG. 12 show that at high power (a) the tuner reflection factor and (b) the RF repeatability are not inferior to air filled tuners at low power see ref. 2), while the temperature of the center conductor is obviously lower. In addition, the dielectric liquid increases the capacitance between tuning probe and center conductor and reduces the electric field in this critical area by the dielectric constant $\varepsilon_r$. This means that, for the same capacitance and the same reflection factor, the distance [S] between tuning probe and center conductor (FIG. 3) is larger and the breakdown (Corona discharge) voltage is increased. This is an additional benefit to the lubrication provided by the cooling Mineral Oil in the SLIDE FIT contact area between tuning probe and slabline walls (FIG. 2).

The following relations apply: C=$\varepsilon o * \varepsilon_r *$A/S {4}, whereby $\varepsilon o=8.854*10^{-12}$F/m, is the universal dielectric constant, $\varepsilon_r$ the relative dielectric constant of the medium (=1 for air, =2.2 for Mineral Oil), A is the opposing surface of the electrodes and S the distance between the electrodes. Or, for the same capacitance the distance S can be 2.2 times larger. The electric field between two charged electrodes is E=V/(S*$\varepsilon_r$), {5} whereby V is the voltage between the two electrodes and S the distance. Or, by using Mineral Oil as dielectricum the tuner can reach the same reflection coefficient (same capacitance) at 2.2 times bigger gap between center conductor and tuning probe, and 2.2 times higher breakdown voltage. Or, the breakdown voltage increases by a factor of $\varepsilon_r^2$ (=2.2*2.2=4.9) and the maximum power before electric breakdown (Corona) increases by $V^2$ meaning, that the maximum power increases by a factor $\varepsilon_r^4$=23.4.

In short, filling the slabline in low loss dielectric liquid brings mostly advantages for the price of a slightly higher tuner loss (FIG. 9) which, in the case of load pull tuners is irrelevant, if the required reflection factor is obtained (FIG. 12A). Tuner loss is accounted for in the calibration of the test system.

Obvious alternative embodiments to the herein disclosed method of controlling the temperature and thermal expansion of the center conductor of slide screw impedance tuners by submerging in cooling, recirculating dielectric liquid, are imaginable and possible but shall not impede on the validity of the basic idea of the present invention.

What I claim is:

1. A slide screw impedance tuner in a tuner housing comprising,
- a parallel plate airline (slabline) having a center conductor, a coaxial test port and a coaxial idle port,
- at least one, remotely controlled, mobile carriage sliding along the axis of the slabline, said carriage comprising a remotely controlled vertical axis holding a metallic tuning probe, insertable into the slot of the slabline and capacitively coupled with the center conductor,
- wherein
  - the channel of the slabline contains a low loss cooling dielectric liquid;
- and a cooling mechanism, integrated in the tuner housing, comprising,
- a container holding cooling liquid and comprising an electric liquid pump and a cooling radiator, and liquid supply pipes inserted into the slabline, allowing the cooling liquid to circulate through the slabline.

2. The tuner as in claim 1, whereby the cooling liquid is Mineral Oil.

3. The tuner as in claim 1, whereby the cooling liquid is Silicon Oil.

4. The tuner as in claim 1,
wherein the liquid-containing slabline channel and center conductor are dimensioned to create a characteristic impedance of 50 Ohm.

5. The tuner as in claim 1, wherein the center conductor is fully submerged in the cooling liquid.

6. The tuner as in claim 1, wherein the cooling liquid supply pipes are inserted close to the test port and to the idle port, forcing the cooling liquid to circulate through the whole length of the slabline.

7. The tuner of claim 6, wherein the liquid supply pipes are inserted at the bottom of the slabline.

* * * * *